(12) United States Patent
Schaller et al.

(10) Patent No.: US 11,851,322 B2
(45) Date of Patent: Dec. 26, 2023

(54) MICROELECTROMECHANICAL SYSTEM (MEMS) SENSOR PACKAGES AND METHODS FOR PRODUCING MICROELECTROMECHANICAL SYSTEM SENSOR PACKAGES HAVING A PLURALITY OF MEMS SENSOR CHIPS

(71) Applicant: Infineon Technologies AG, Neubiberg (DE)

(72) Inventors: Rainer Markus Schaller, Saal a.d. Donau (DE); Jochen Dangelmaier, Beratzhausen (DE)

(73) Assignee: Infineon Technologies AG, Neubiberg (DE)

( * ) Notice: Subject to any disclaimer, the term of this patent is extended or adjusted under 35 U.S.C. 154(b) by 372 days.

(21) Appl. No.: 17/249,853

(22) Filed: Mar. 16, 2021

(65) Prior Publication Data

US 2021/0300749 A1 Sep. 30, 2021

(30) Foreign Application Priority Data

Mar. 30, 2020 (DE) .......................... 102020108775.6

(51) Int. Cl.
*B81B 7/00* (2006.01)
*G01L 9/08* (2006.01)
*B81C 1/00* (2006.01)

(52) U.S. Cl.
CPC .......... *B81B 7/007* (2013.01); *B81C 1/00301* (2013.01); *G01L 9/08* (2013.01); *B81B 2201/0264* (2013.01); *B81B 2203/0127* (2013.01); *B81B 2207/012* (2013.01); *B81B 2207/095* (2013.01); *B81C 2203/0154* (2013.01); *B81C 2203/0792* (2013.01)

(58) Field of Classification Search
None
See application file for complete search history.

(56) References Cited

U.S. PATENT DOCUMENTS

| | | | |
|---|---|---|---|
| 7,275,424 B2 * | 10/2007 | Felton | B81C 1/0023 73/104 |
| 2006/0185429 A1 | 8/2006 | Liu et al. | |
| 2015/0153378 A1 | 6/2015 | Kim et al. | |
| 2015/0166330 A1 | 6/2015 | Lee | |
| 2016/0046483 A1 | 2/2016 | Cheng et al. | |
| 2016/0305837 A1 * | 10/2016 | Froemel | G01L 9/0073 |
| 2018/0297834 A1 * | 10/2018 | Renaud-Bezot | B81C 1/00873 |

FOREIGN PATENT DOCUMENTS

| | | |
|---|---|---|
| DE | 102014117757 A1 | 6/2015 |
| DE | 102014117762 A1 | 6/2015 |
| DE | 102014019445 A1 | 7/2015 |
| EP | 2693184 A2 | 2/2014 |
| EP | 3205997 A1 | 8/2017 |

* cited by examiner

*Primary Examiner* — Peter J Macchiarolo
*Assistant Examiner* — Jermaine L Jenkins
(74) *Attorney, Agent, or Firm* — Harrity & Harrity, LLP

(57) ABSTRACT

A sensor package comprises a MEMS sensor chip, a cover arranged over a first main surface of the MEMS sensor chip, said cover being fabricated from a mold compound, and an electrical through contact extending through the cover and to electrically couple the sensor package to a circuit board arranged over the cover.

22 Claims, 12 Drawing Sheets

MICROELECTROMECHANICAL SYSTEM (MEMS) SENSOR PACKAGES AND METHODS FOR PRODUCING MICROELECTROMECHANICAL SYSTEM SENSOR PACKAGES HAVING A PLURALITY OF MEMS SENSOR CHIPS

CROSS REFERENCE TO RELATED APPLICATION

This application claims priority to German Patent Application No. 102020108775.6, filed on Mar. 30, 2020, the contents of which are incorporated by reference herein in their entirety.

TECHNICAL FIELD

The present disclosure relates to sensor packages and methods for producing sensor packages.

BACKGROUND

MEMS (microelectromechanical systems)-based sensor devices can detect pressures, accelerations, light or gas, for example. In one example, such sensor devices can be part of a tire pressure monitoring system for monitoring the tire pressure in motor vehicles. Accidents resulting from incorrect tire pressure can be avoided by way of the monitoring. Furthermore, with optimum tire pressure, fuel can be saved and unnecessary tire wear can be avoided. The components of the sensor devices can be arranged in a package (housing) in order to enable simple handling and mounting of the sensor device on circuit boards and to protect the components against damage. Manufacturers of sensor packages are constantly endeavoring to improve their products.

BRIEF DESCRIPTION

Various aspects relate to a sensor package. The sensor package comprises a MEMS sensor chip. The sensor package furthermore comprises a cover arranged over a first main surface of the MEMS sensor chip, the cover being fabricated from a mold compound. The sensor package furthermore comprises an electrical through contact extending through the cover and configured to electrically couple the sensor package to a circuit board arranged over the cover.

Various aspects relate to a method for producing sensor packages. The method comprises providing a first semiconductor wafer having a plurality of MEMS sensor chips. The method furthermore comprises carrying out a molding process over a first main surface of the first semiconductor wafer, wherein a cover is formed over the plurality of MEMS sensor chips. The method furthermore comprises forming electrical through contacts extending through the cover. The method furthermore comprises singulating the first semiconductor wafer and the cover into a plurality of sensor packages, wherein each of the sensor packages comprises one of the electrical through contacts, which is configured to electrically couple the sensor package to a circuit board arranged over the cover of the sensor package.

BRIEF DESCRIPTION OF THE DRAWINGS

Sensor packages and methods for producing sensor packages in accordance with the disclosure are explained in greater detail below with reference to drawings. The elements shown in the drawings are not necessarily rendered in a manner true to scale relative to one another. Identical reference signs can designate identical components.

DETAILED DESCRIPTION

The FIGS. described below show sensor packages and methods for producing sensor packages in accordance with the disclosure. In this case, the methods and devices described may be illustrated in a general way in order to describe aspects of the disclosure qualitatively. The methods and devices described may have further aspects that may not be shown in the respective FIG. for the sake of simplicity. However, the respective example may be extended by aspects described in connection with other examples in accordance with the disclosure. Consequently, explanations concerning a specific FIG. may equally apply to examples of other figures.

Figure 1:
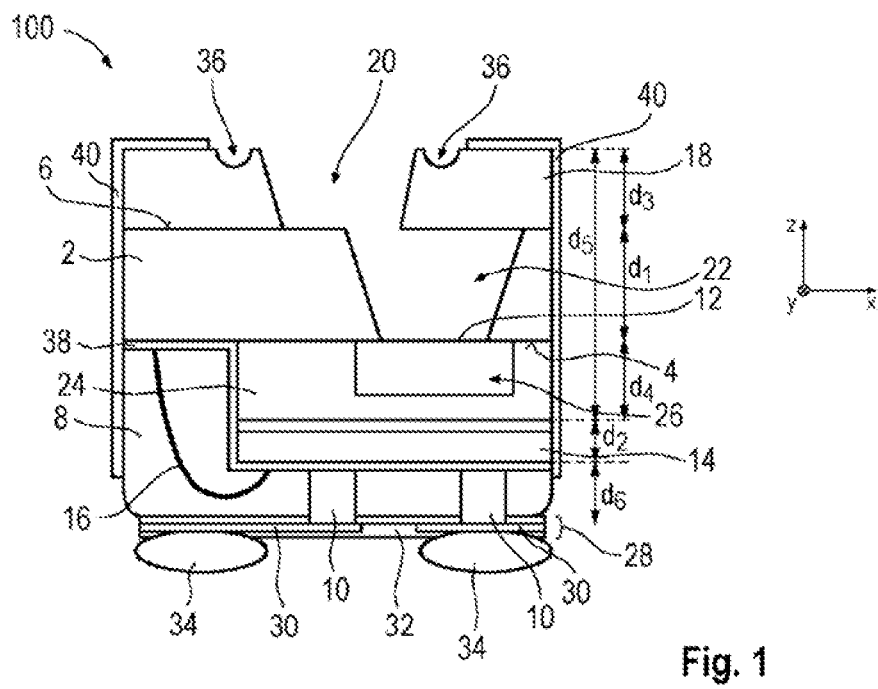
FIG. 1 shows a cross-sectional side view of a sensor package 100 in accordance with the disclosure.

The sensor package (or sensor housing) 100 in FIG. 1 can comprise a MEMS sensor chip 2 having a first main surface 4 and a second main surface 6 situated opposite. A cover 8 can be arranged over the first main surface 4 of the MEMS sensor chip 2, which cover can be fabricated from a mold compound. One or more electrical through contacts 10 can extend through the cover 8 and can be configured to electrically couple the sensor package 100 to a circuit board (not shown) arranged over the cover 8.

The MEMS sensor chip 2 can be a semiconductor chip having one or more MEMS structures that can be integrated into the MEMS sensor chip 2. A MEMS structure 12 in the form of a membrane is illustrated by way of example in the example in FIG. 1. The MEMS structures can comprise one or more of the following: bridges, membranes, cantilevers, spring beams, tongue structures, comb structures, etc. The MEMS sensor chip 2 can be configured to detect one or more physical variables, for example pressure, acceleration, temperature, air humidity, etc. Examples of sensors are pressure sensors, tire pressure sensors, acceleration sensors, gas sensors, air humidity sensors, etc. A thickness $d_1$ of the MEMS sensor chip 2 in the z-direction can be in a range of approximately 300 micrometers to approximately 500 micrometers, more precisely of approximately 350 micrometers to approximately 450 micrometers. One typical example value for the thickness $d_1$ of the MEMS sensor chip 2 can be approximately 400 micrometers.

The cover 8 can be fabricated using a molding process. In particular, the cover 8 can be produced on the basis of one or more of the following techniques: compression molding, injection molding, powder molding, liquid molding, etc. A mold compound that forms the cover 8 can comprise at least one from an epoxy, a filled epoxy, a glass-fiber-filled epoxy, an imide, a thermoplastic, a thermosetting polymer, a polymer mixture.

The cover 8 and the MEMS sensor chip 2 can be substantially congruent in a plan view of the first main surface 4 of the MEMS sensor chip 2, e.g. as viewed in the z-direction. Such congruence can result naturally from the method for producing the sensor package 100, as evident from FIGS. 2 to 5, for example. The sensor package 100 can thus correspond to a CSP (Chip-Scale Package or Chip-Size Package). Furthermore, the sensor package 100 can be a wafer-level package.

In the example in FIG. 1, the sensor package 100 can comprise a logic chip 14 arranged between the MEMS sensor chip 2 and the cover 8. In further examples, the logic chip 14 need not necessarily be part of the sensor package 100, but rather can also be arranged as a separate electronic component alongside the sensor package 100 on an identical circuit board and be electrically connected to the sensor package 100. The logic chip 14 or one or more circuits contained therein can be configured to logically process measurement signals provided by the MEMS sensor chip 2. The logic chip 14 can be for example an ASIC (Application Specific Integrated Circuit). The electrical through contacts 10 can electrically contact the logic chip 14 and be configured to electrically couple the logic chip 14 to a circuit board (not shown). A thickness $d_2$ of the logic chip 14 in the z-direction can be in a range of approximately 80 micrometers to approximately 120 micrometers, more precisely of 90 micrometers to approximately 110 micrometers. One typical example value for the thickness $d_2$ of the logic chip 14 can be approximately 100 micrometers.

In one example, movements of the MEMS structure 12 can be converted into electrical signals on the basis of a piezoelectric effect. The measurement signals detected by the MEMS sensor chip 2 can be communicated by way of one or more electrical connection elements 16 to the logic chip 14 in order to be logically processed there. In the example in FIG. 1, the electrical connection element 16 is represented by a wire by way of example. In further examples, the electrical connection element 16 can be embodied differently, for example in the form of a tape, a clip or a redistribution layer.

The sensor package 100 can comprise a first structure 18 arranged over the second main surface 6 of the MEMS sensor chip 2. The first structure 18 can be fabricated from at least one from a glass material or a semiconductor material. In particular, the first structure 18 can result from a singulation of a substrate (e.g. a glass substrate and/or a semiconductor substrate), as described in association with FIGS. 2A to 5G. A thickness $d_3$ of the first structure 18 in the z-direction can be in a range of approximately 300 micrometers to approximately 500 micrometers, more precisely of 350 micrometers to approximately 450 micrometers. One typical example value for the thickness $d_3$ of the first structure 18 can be approximately 400 micrometers.

A gas opening 20 can be formed in the first structure 18, the gas opening being arranged over the second main surface 6 of the MEMS sensor chip 2. The gas opening 20 can provide a (fluidic) gas connection between the surroundings of the sensor package 100 and the MEMS sensor chip 2 or the membrane/MEMS structure 12 thereof. By this means, pressure changes that occur in the surroundings, in particular, can be detected by the MEMS sensor chip 2. In the example in FIG. 1, the gas connection can additionally have a cutout 22 formed in the semiconductor material of the MEMS sensor chip 2. In the example side view in FIG. 1, the gas opening 20 can have a conical shape. In further examples, the shape of the gas opening 20 can deviate therefrom and be rectangular, for example.

One or more depressions 36 can optionally be formed on the top side of the first structure 18. When viewed in the z-direction, the depression 36 can have a closed shape, for example a circular shape. The depression 36 can be configured to receive a sealing ring (not shown). In one example, the sealing ring can provide a connection between the sensor package 100 and a valve.

The sensor package 100 can comprise a second structure 24 arranged over the first main surface 4 of the MEMS sensor chip 2. The second structure 24 can be at least partly similar to the first structure 18, in particular with regard to its material and its thickness $d_4$ in the z-direction. A thickness $d_5$ of the stack consisting of the first structure 18, the second structure 24 and the MEMS sensor chip 2 can result from the already mentioned thicknesses of its stack components. One typical example value for a thickness $d_5$ of the stack can be approximately 1200 micrometers. A cavity 26 can be formed in the second structure 24 and under the membrane/MEMS structure 12, which cavity can be configured as back volume of a pressure sensor, for example.

The sensor package 100 can comprise a redistribution layer 28 arranged on the underside of the cover 8. The redistribution layer 28 can contain one or more conductor tracks 30 in in the form of metal layers or metal tracks, which can extend substantially parallel to the underside of the sensor package 100. The conductor tracks 30 can be fabricated from copper or a copper alloy, for example. One or more dielectric layers 32 can be arranged between the conductor tracks 30 in order to electrically insulate the conductor tracks 30 from one another. The dielectric layers 32 can be fabricated from an oxide and/or a nitride, for example. Furthermore, metal layers arranged on different planes can be electrically connected to one another by a multiplicity of through contacts or vias. The conductor tracks 30 of the redistribution layer 28 can fulfil the function of redistribution or rewiring in order to electrically couple the electrical through contacts 10 to one or more peripheral connection elements 34. In other words, the conductor tracks 30 can be configured to provide the electrical through contacts 10 or connections of the logic chip 14 at other positions of the sensor package 100. Alternatively or additionally, one or more of the conductor tracks 30 can be configured to provide one or more electronic components (or functional elements). The electronic components can comprise passive electronic components, in particular. A passive electronic component can comprise for example one or more of the following: resistor, capacitor, inductive component (e.g. inductance or coil), antenna (e.g. coil or patch antenna), etc.

The peripheral connection elements 34 can be arranged below the cover 8 and be electrically coupled to the electrical through contacts 10. In the example in FIG. 1, the peripheral connection elements 34 can be embodied in the form of solder deposits (or solder elements or solder balls). The peripheral connection elements 34 can be configured to electrically and mechanically couple the sensor package 100 to a circuit board. The sensor package 100 can be mounted on a circuit board by way of the peripheral connection elements 34 using a soldering process, for example.

In some examples, the sensor package 100 need not necessarily comprise the peripheral connection elements 34 and/or the redistribution layer 28, but rather can be mechanically coupled to a circuit board directly by way of the electrical through contacts 10. The electrical through contacts 10 can comprise at least one from a press-fit pin, a metal column, a clip or a bond wire. Various examples of electrical through contacts 10 are shown and described in FIGS. 2 to 5. The electrical through contacts 10 can be embodied as electrical via (vertical interconnect access) connections. A dimension of the electrical through contacts 10 in the z-direction or a corresponding thickness $d_6$ of the cover 8 can be in a range of approximately 300 micrometers to approximately 500 micrometers, more precisely of 350 micrometers to approximately 450 micrometers. One typical example value for the thickness $d_6$ of the cover can be approximately 400 micrometers.

The sensor package 100 can optionally comprise a layer 38 that can be arranged on the cover 8. The layer 38 can be arranged respectively between the cover 8 and the MEMS sensor chip 2, between the cover 8 and the second structure 24, and between the cover 8 and the logic chip 14. The layer 38 can be configured to reduce mechanical stresses between the components mentioned. Alternatively or additionally, the layer 38 can be configured to provide or to reinforce an adhesion between the components mentioned. The layer 38 can be fabricated for example from a polymeric coating material, in particular parylene.

The sensor package 100 can optionally comprise a coating 40 that can be arranged on one or more sidewalls of the sensor package 100. The coating 40 can be configured as a passivation layer, in particular. The coating 40 can be fabricated for example from a polymeric coating material, in particular parylene.

In the example in FIG. 1, the MEMS sensor chip 2 can be configured to detect pressure signals. In other words, the sensor package 100 can be a pressure sensor, which can be part of a tire pressure monitoring system, for example. Pressure changes that occur in the surroundings in a gas (e.g. air) surrounding the sensor package 100 can lead, by way of the gas opening 20, to a deflection of the membrane/MEMSs structure 12 and can be converted into electrical signals. The electrical signals can be forwarded to the logic chip 14 and be processed by the latter. The processed signals can be forwarded by way of the electrical through contacts 10 and the peripheral connection elements 34 to a circuit board or electrical components arranged on the circuit board.

It should be noted that the sensor package 100 is not restricted to a specific type of sensor. In further examples, the sensor package 100 can be configured for example to detect accelerations. The sensor package 100 can also be configured to detect not just one, but a plurality of physical variables. By way of example, the sensor package 100 can be configured both as a pressure sensor and as an acceleration sensor, as is shown and described in FIGS. 6A-6B.

FIGS. 2A to 2I show a method for producing sensor packages 200 in accordance with the disclosure. By way of example, the sensor package 100 in FIG. 1 can be produced in accordance with the method in FIGS. 2A-2I. The method steps described can be carried out at the wafer level, in particular. The sensor packages 200 produced can thus be wafer-level packages.

Figure 2A:
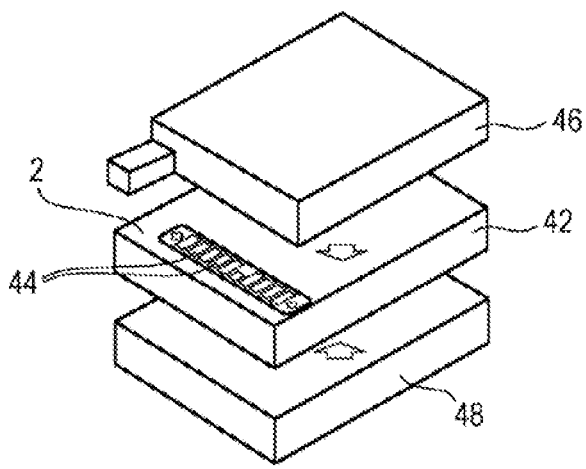
FIGS. 2A to 2I show a perspective view of a method for producing sensor packages 200 in accordance with the disclosure.

In FIG. 2A, a semiconductor wafer 42 can be provided, which can have a multiplicity of MEMS sensor chips 2. The MEMS sensor chips 2 can be similar to the MEMS sensor chip 2 in FIG. 1, for example. Only one MEMS sensor chip 2 of the semiconductor wafer 42 is shown in FIG. 2A for the sake of simplicity. However, the semiconductor wafer 42 can have hundreds of MEMS sensor chips 2, for example. The MEMS sensor chip 2 can have on its top side one or more electrical terminals 44, which can be configured as signal inputs and/or signal outputs.

A first substrate (or a first wafer) 46 can be arranged over the top side of the semiconductor wafer 42 and can be mechanically connected to the semiconductor wafer 42 or the upper main surface thereof. The first substrate 46 can be fabricated from at least one from a glass material or a semiconductor material, in particular silicon. The first substrate 46 and the semiconductor wafer 42 can be connected to one another using an anodic bonding process, for example. The first substrate 46 can have a plurality of cutouts, which can be similar to the cavity 26 in FIG. 1, but are not illustrated in FIG. 2A for the sake of simplicity. Before the two components are connected, the cutouts can be aligned with MEMS structures of the MEMS sensor chips 2 of the semiconductor wafer 42. By way of example, each MEMS sensor chip 2 can have a membrane over which a cutout is arranged (cf. FIG. 1).

In an analogous manner, a second substrate (or a second wafer) 48 can be arranged over the underside of the semiconductor wafer 42 and can be mechanically connected to the semiconductor wafer 42. The second substrate 48 can be at least partly similar to the first substrate 46. The thicknesses of the substrates 46 and 48 can correspond to the thicknesses $d_3$ and $d_4$ of the structures 18 and 24 in FIG. 1, for example. The second substrate 48 can have gas openings, which can be similar to the gas opening 20 in FIG. 1, but are not explicitly illustrated. Before the two components are connected, the gas openings can be aligned with the MEMS sensor chips 2 of the semiconductor wafer 42, as is shown by way of example in FIG. 1.

Figure 2B:
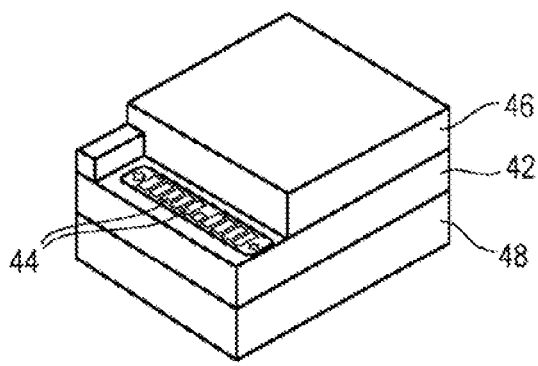

FIG. 2B shows the semiconductor wafer 42 and the substrates 46, 48 in an interconnected state. The components can form a stack, and so hereinafter reference may also be made to a wafer stack. In a plan view, each of the components 42, 46 and 48 and thus the combined wafer stack can have a circular shape. In further examples, each of the components 42, 46 and 48 can correspond to a panel and have a rectangular shape. It is evident from FIG. 2B that the first substrate 46 can be embodied such that the electrical terminals 44 of the MEMS sensor chip 2 can be exposed and can be contacted.

Figure 2C:
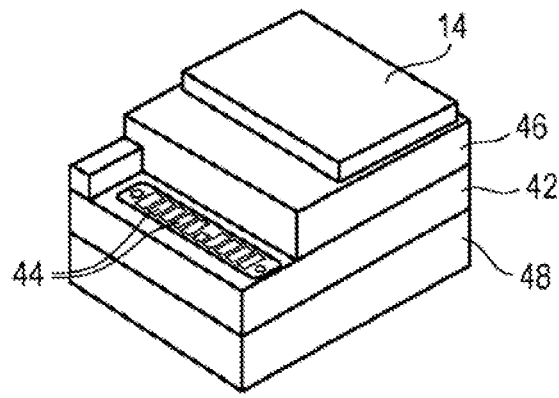

In FIG. 2C, a multiplicity of logic chips 14 can be arranged over the upper main surface of the first substrate 46. In particular, in this case, a logic chip 14 can be positioned over each of the MEMS sensor chips 2 of the semiconductor wafer 42. The logic chips 14 can be at least partly similar to the logic chip 14 in FIG. 1. In one example, the plurality of logic chips 14 can be provided individually and be arranged over the first substrate 46 using a pick-and-place process. In a further example, the plurality of logic chips 14 can be provided in the form of a semiconductor wafer that can be connected to the first wafer 46, for example using an anodic bonding process.

Figure 2D:
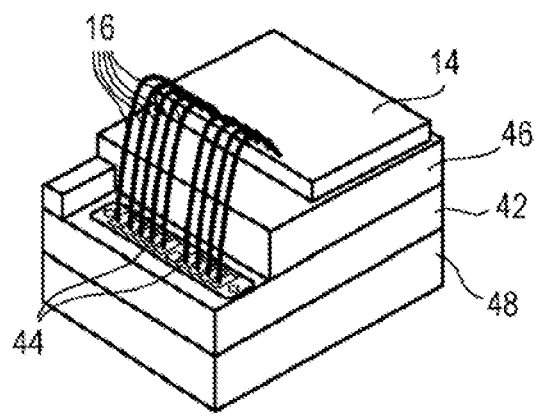

In FIG. 2D, the logic chips 14 can be electrically coupled to the MEMS sensor chips 2 of the semiconductor wafer 42 using electrical connection elements 16. In particular, in this case, the electrical connection elements 16 can be connected to the electrical terminals 44 of the MEMS sensor chips 2. In the example in FIG. 2D, the electrical connection elements 16 are represented by wires by way of example. In further examples, the electrical connection elements 16 can be embodied differently, for example using clips or tapes.

Figure 2E:
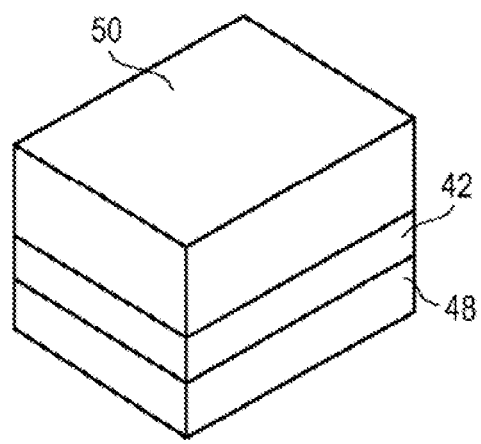

In FIG. 2E, a molding process can be carried out over the upper main surfaces of the semiconductor wafer 42, of the first substrate 46 and of the logic chips 14. A cover 50 can be formed over these components as a result. In this case, the cover 50 can cover the entire surface of the wafer stack, e.g. all the components thereof. The molding process can be based on one or more of the following techniques: compression molding, injection molding, powder molding, liquid molding, etc.

Figure 2F:
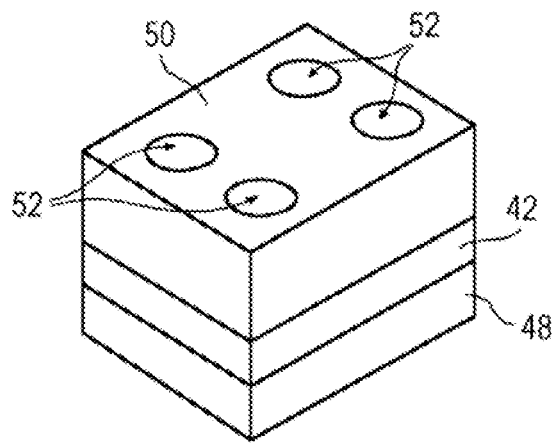

In FIG. 2F, a plurality of through holes (or via holes) 52 can be formed in the cover 50. Four through holes 52 are shown by way of example in FIG. 2F. In further examples, the number of through holes 52 can be chosen differently. The through holes 52 can be produced for example using at least one from drilling, laser drilling, etching, etc.

Figure 2G:
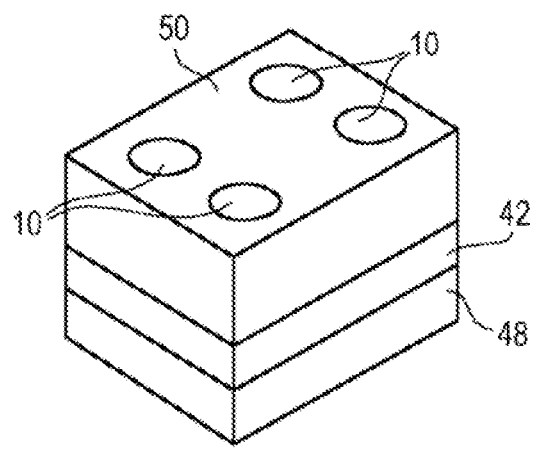

In FIG. 2G, electrical through contacts 10 can be formed in the through holes 52. The electrical through contacts 10 can extend from the top side of the cover 50 to the logic chips 14, or the terminals thereof, situated under the cover 50 and can electrically contact these. In one example, the electrical through contacts 10 can be produced in the through holes 52 by press-fit pins being pressed into the through holes 52. One example press-fit method that can be employed for this purpose is shown and described in FIG. 7.

Figure 2H:
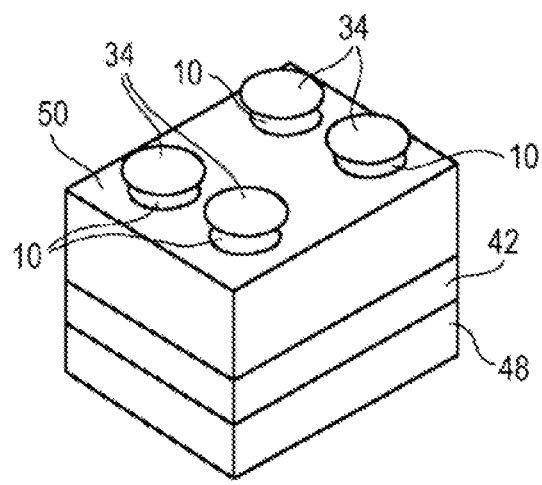

In FIG. 2H, peripheral connection elements 34 can be arranged over the electrical through contacts 10. The peripheral connection elements 34 can be configured to electrically and mechanically connect a respective sensor package to be produced from the wafer stack to a circuit board. In the example in FIG. 2H, the peripheral connection elements 34 can be embodied for example as solder deposits for a soldering process to be carried out later. An arrangement of the peripheral connection elements 34 can be implemented in particular if the press-fit pins used have not already been plated with a solder material.

Figure 2I:
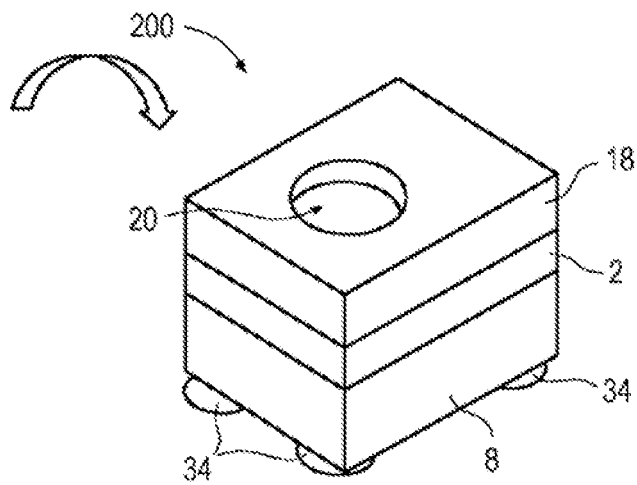

In FIG. 2I, the wafer stack having the components 42, 46, 48 and the cover 50 can be singulated into a plurality of sensor packages 200. The singulation process can comprise for example an etching process, a plasma dicing process, a mechanical ultrasonic dicing process, a laser dicing process, or a combination thereof. The sensor package 200 can be at least partly similar to the sensor package 100 of FIG. 1. For this reason, reference signs from FIG. 1 are used in FIG. 2I. Each of the sensor packages 200 produced can comprise one or more of the electrical through contacts 10 and/or peripheral connection elements 34, which can be configured to electrically connect the sensor package 200 to a circuit board arranged over the cover 8 of the sensor package 200. FIG. 2I shows a flipped sensor package 200 (cf. arrow), in the case of which a gas opening 20 is discernible. The gas opening 20 is formed in the structure 18 produced from the second substrate 48.

The method in FIGS. 2A-2I can comprise further steps, which are not shown for the sake of simplicity. Such further steps enable additional components to be produced, for example, such as are shown in FIG. 1, for example a redistribution layer, a sidewall coating, etc.

FIGS. 3A to 3H show a method for producing sensor packages 300 in accordance with the disclosure. The method in FIGS. 3A-3H can be at least partly similar to the method in FIGS. 2A-2I, for example.

Figure 3A:
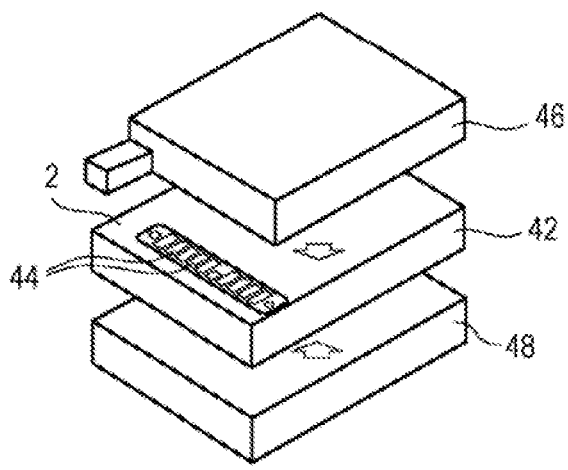
FIGS. 3A to 3H show a perspective view of a method for producing sensor packages 300 in accordance with the disclosure.
Figure 3B:
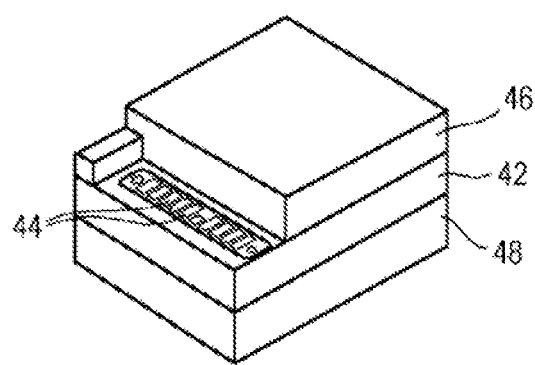

The steps shown in FIGS. 3A and 3B can at least partly be similar or correspond to the steps in FIGS. 2A and 2B.

Figure 3C:
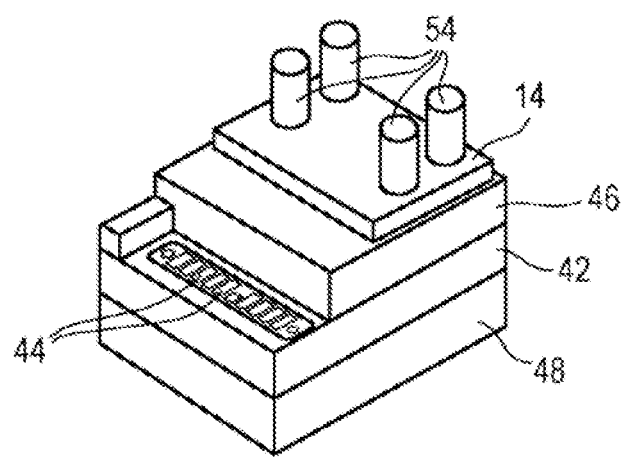

In FIG. 3C, a multiplicity of logic chips 14 can be arranged over the upper main surface of the first substrate 46, as was described in association with FIG. 2C. In addition, the logic chips 14 can be electrically contacted with electrical contact elements 54 on their top side. In the example in FIG. 3C, the electrical contact elements 54 can be metal columns (or pins), which can be fabricated from a metal and/or a metal alloy. In particular, the metal columns 54 can be produced from copper and/or a copper alloy. In the example in FIG. 3C, the metal columns 54 are embodied in a cylindrical fashion. In further examples, the metal columns 54 can have a different shape, for example the shape of a parallelepiped. The metal columns 54 can be plated, for example with tin and/or NiPdAu.

In one example, firstly the metal columns 54 can be arranged on the logic chips 14 and then the logic chips 14 can be arranged on the first substrate 46. In a further example, firstly the logic chips 14 can be arranged on the first substrate 46 and the metal columns 54 can then be arranged on the logic chips 14. The metal columns 54 can be provided individually and be arranged on the logic chips 14 using a pick-and-place process. As an alternative thereto, the metal columns 54 can be part of a leadframe. The leadframe or the metal columns 54 can be aligned with electrical contacts of the logic chips 14 and be connected using a soldering and/or adhesive bonding process.

Figure 3D:
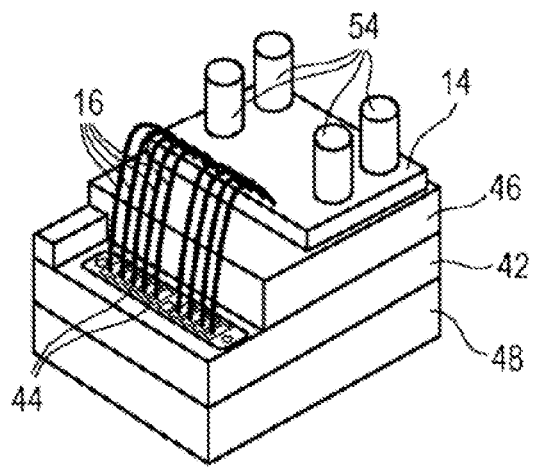
Figure 3E:
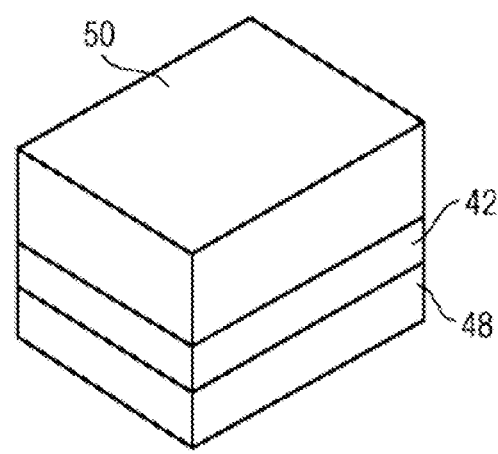

The steps shown in FIGS. 3D and 3E can at least partly be similar or correspond to the steps in FIGS. 2D and 2E.

Figure 3F:
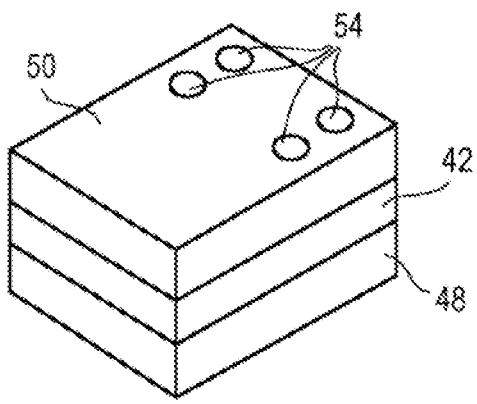

It is evident from FIG. 3E that the metal columns 54 can be covered, in particular completely, by a cover 50. In FIG. 3F, material can be removed from the top side of the cover 50. As a result, the metal columns 54 can be at least partly exposed. The material can be removed by employing at least one of the following techniques: grinding, chemical mechanical polishing, etching, etc. After the material has been removed, the mold compound of the cover 50 and the metal columns 54 can be arranged in a coplanar manner, e.g. can lie in a common plane. The metal columns 54 can extend from electrical contacts of the logic chips 14 as far as the top side of the cover 50 and can provide an electrical access to the logic chips 14, which are otherwise embedded in the mold compound. The metal columns 54 extending through the cover 50 in FIG. 3F can for example be similar to or be identified with the electrical through contacts 10 from FIGS. 1 and 2G.

Figure 3G:
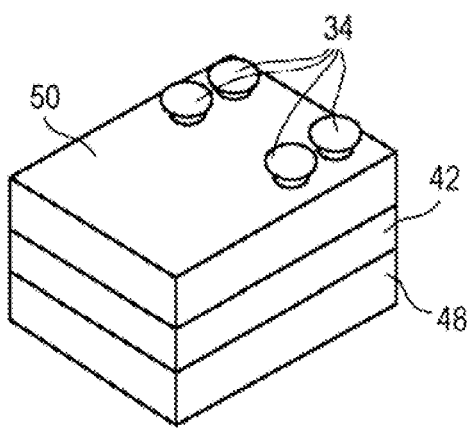
Figure 3H:
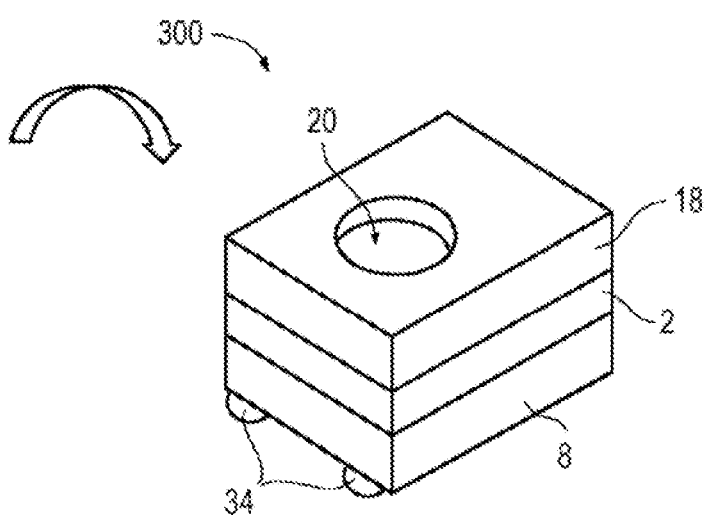

The steps shown in FIGS. 3G and 3H can at least partly be similar or correspond to the steps in FIGS. 2G and 2H.

FIGS. 4A to 4F, which show a method for producing sensor packages 400 in accordance with the disclosure. The method in FIGS. 4A-4F can be at least partly similar to one of the methods in FIGS. 2A-3H, for example.

Figure 4A:
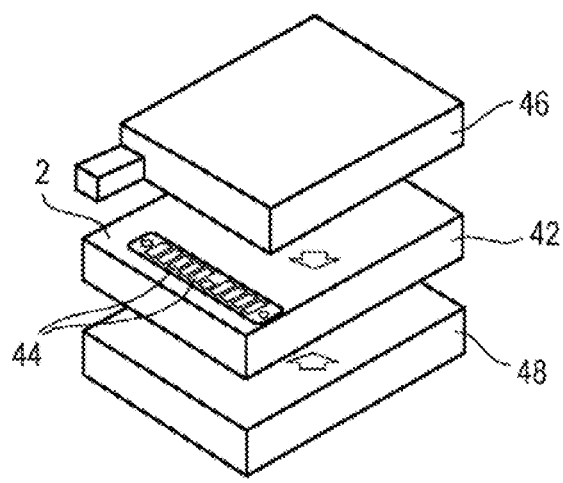
FIGS. 4A to 4F show a perspective view of a method for producing sensor packages 400 in accordance with the disclosure.
Figure 4B:
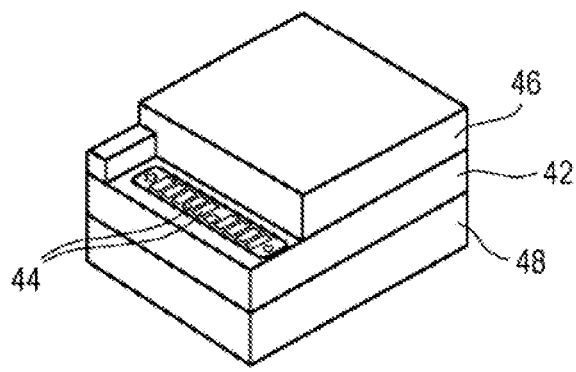
Figure 4C:
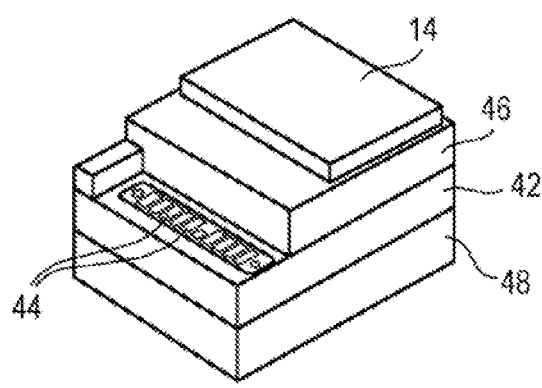

The steps shown in FIGS. 4A to 4C can at least partly be similar or correspond to the steps in FIGS. 2A to 2C.

Figure 4D:
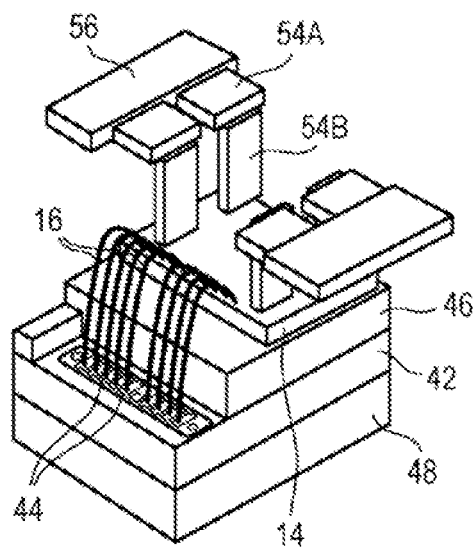

In FIG. 4D, the logic chips 14 can be electrically coupled to the MEMS sensor chips of the semiconductor wafer 42 using electrical connection elements 16, as was described in connection with FIG. 2D, for example. Furthermore, the logic chips 14 can be electrically contacted with electrical contact elements 54 on their top side, in a manner similar to that as already described in association with FIG. 3C. In contrast to FIG. 3C, in the example in FIG. 4D, the electrical contact elements 54 can be clips that can be fabricated from a metal and/or a metal alloy. In particular, the clips 54 can be produced from copper and/or a copper alloy.

The clips 54 can be provided as part of a leadframe. The production of the leadframe can comprise a plurality of method steps, for example etching processes or 3D printing processes. In one example, the leadframe can be a plated leadframe (PPF, Pre Plated Frame). The leadframe or the clips 54 can be aligned with electrical contacts of the logic chips 14 and can be connected using a soldering and/or adhesive bonding process. A connection between the clips 54 and the electrical contacts of the logic chips 14 can be effected for example using one or more of welding, adhesive bonding or soldering. In one example, the leadframe can cover the entire main surface of the wafer stack. In further examples, the main surface of the wafer stack can be covered by a plurality of leadframe strips. In the example in FIG. 4D, the clips 54 can have a substantially rectangular course with a horizontally extending section 54A and a vertically extending section 54B. Furthermore, FIG. 4D illustrates connection sections 56, which indicate a connection of the clips 54 shown to further clips that are arranged over adjacent logic chips 14 and are likewise part of the leadframe.

Figure 4E:
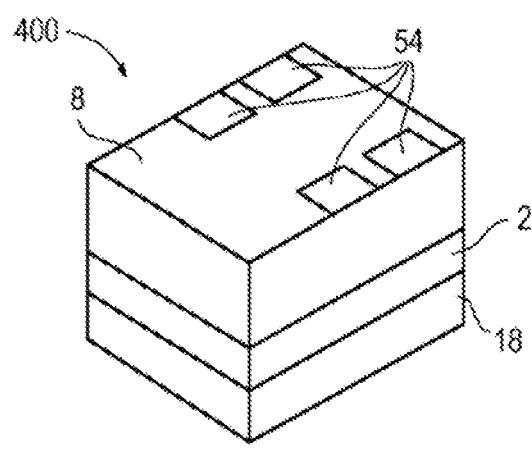
Figure 4F:
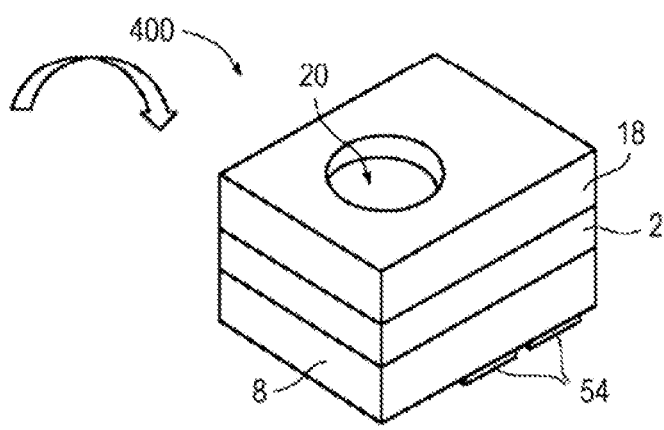

The steps shown in FIGS. 4E and 4F can at least partly be similar or correspond to the steps in FIGS. 3E, 3F and 3H. In FIG. 4E, a molding process can be carried out over the upper main surfaces of the semiconductor wafer 42, of the first substrate 46 and of the logic chips 14, wherein a cover is formed. Afterward, material can be removed from the top side of the cover, as a result of which the clips 54 are at least partly exposed. The wafer stack and the cover can be singulated into a plurality of sensor packages 400. It is evident from FIG. 4E that the connection sections 56 of the leadframe does not have to be contained in the finished produced sensor package 400. FIG. 4F shows a bottom view of the sensor package 400 shown in FIG. 4E.

FIGS. 5A to 5G, which show a method for producing sensor packages 500 in accordance with the disclosure. The method in FIGS. 5A-5G can be at least partly similar to the method in FIGS. 4A-4F, for example.

Figure 5A:
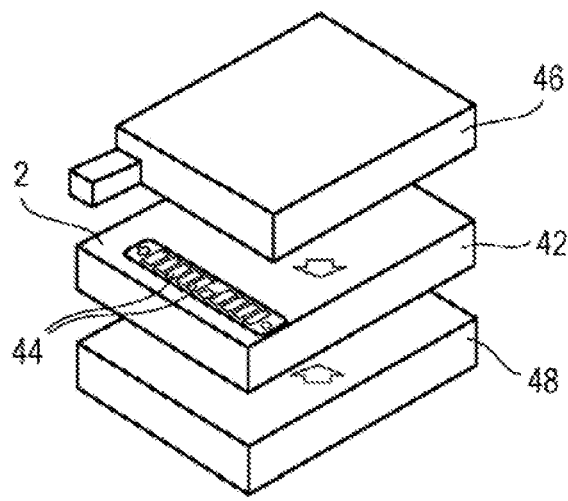
FIGS. 5A to 5G show a perspective view of a method for producing sensor packages 500 in accordance with the disclosure.
Figure 5B:
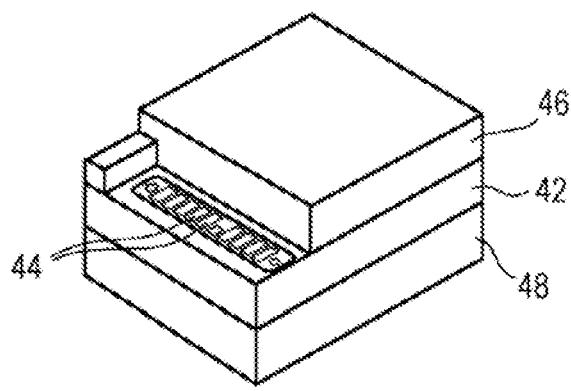
Figure 5C:
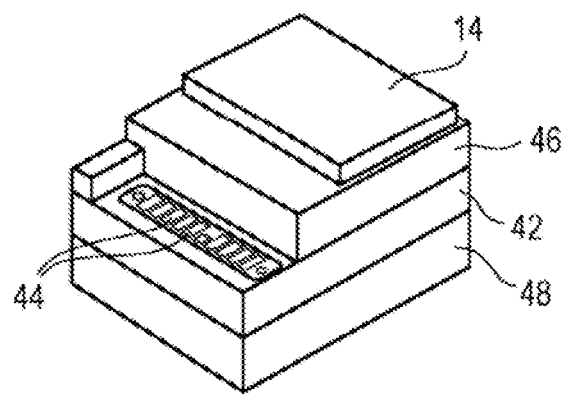

The steps shown in FIGS. 5A to 5C can at least partly be similar or correspond to the steps in FIGS. 4A to 4C.

Figure 5D:
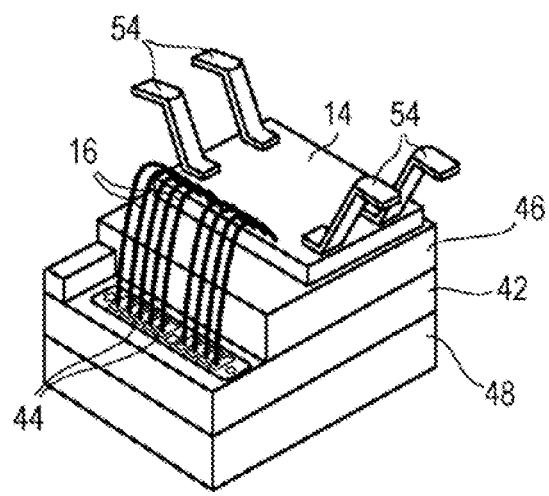

The step shown in FIG. 5D can at least partly be similar or correspond to the step in FIG. 4D. In contrast to FIG. 4D, in the example in FIG. 5D, the electrical contact elements 54 can be wires (or bond wires). In some examples, the bond wires can have such high thicknesses that they can also be regarded as clips. In the example in FIG. 5D, the bond wires 54 can be embodied in a substantially S-shaped fashion. In further examples, a different shape of the bond wires 54 can be chosen. The bond wires 54 can be provided individually or in an assemblage (e.g. in the form of a leadframe).

Figure 5E:
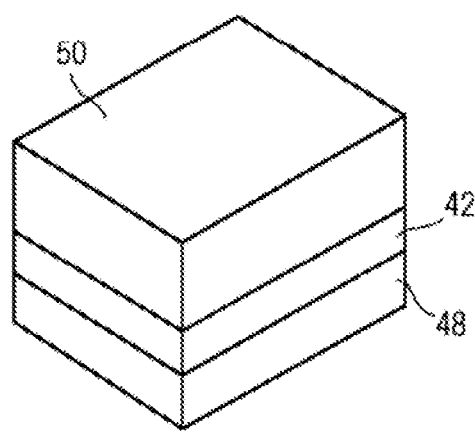
Figure 5F:
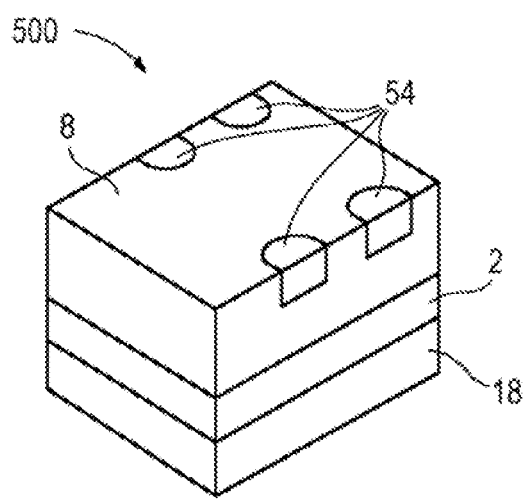
Figure 5G:
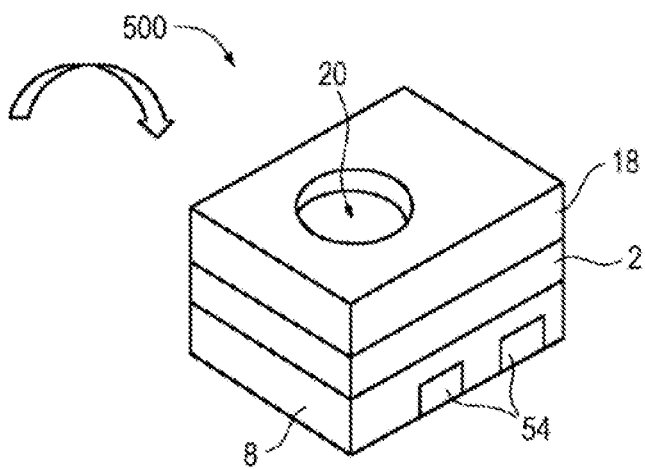

FIGS. 5E to 5G shows steps such as have substantially already been described in previous figures. In FIG. 5E, a molding process can be carried out over the wafer stack and the logic chips 14, wherein a cover 50 is formed. Afterward, material can be removed from the top side of the cover 50, as a result of which the bond wires (or clips) 54 are at least partly exposed. In an additional step (not shown), solderable material can be arranged on the exposed surfaces of the bond wires 54, for example using plating or by arranging solder deposits. The wafer stack and the cover 50 can be singulated into a plurality of sensor packages 500. It is evident from FIG. 5F that the bond wires 54 can be exposed both at the top side and at one or more side surfaces of the sensor package 500. The bond wires 54 exposed at the side surfaces can simplify an LTI (Lead Tip Inspection) method to be carried out. FIG. 5G shows a bottom view of the sensor package 500 shown in FIG. 5F.

Figure 6A:
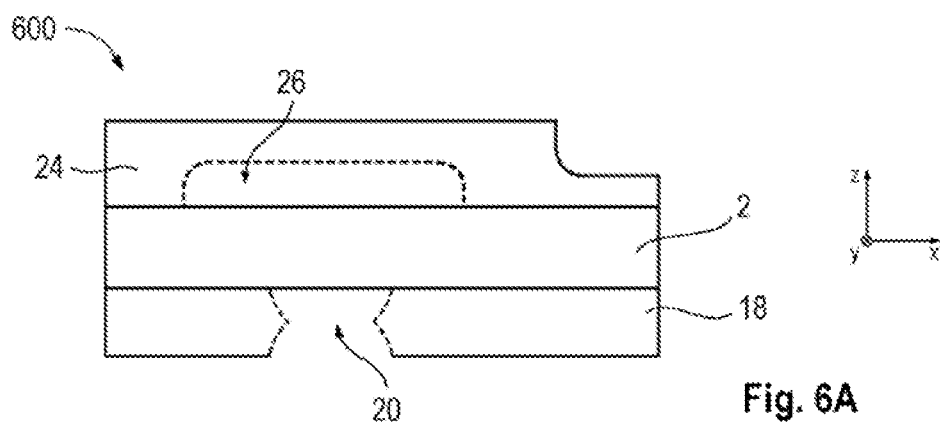
FIGS. 6A and 6B show a side view and a plan view of a sensor package 600 in accordance with the disclosure.
Figure 6B:
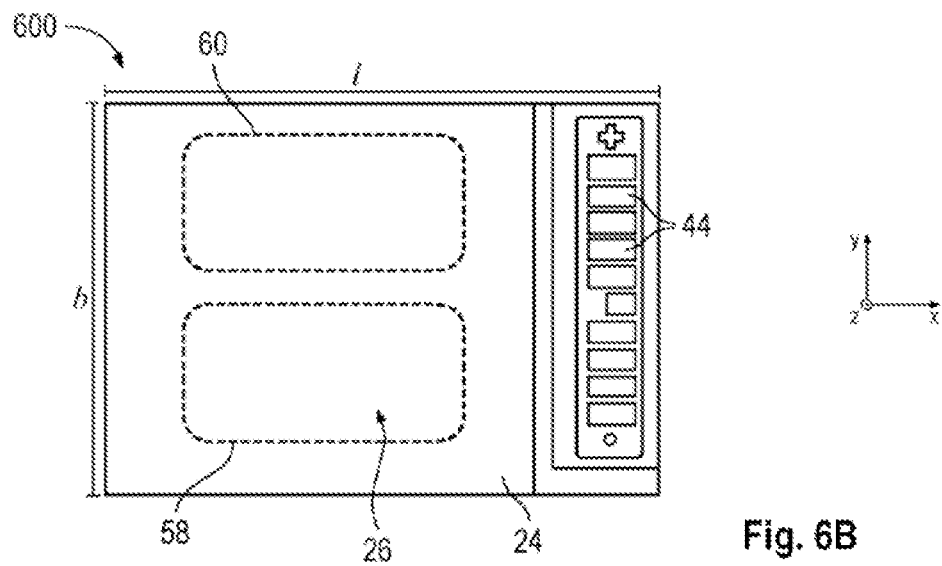

FIGS. 6A and 6B show a side view and a plan view, respectively, of a sensor package 600 in accordance with the disclosure. The sensor package 600 can be at least partly similar to the sensor package 100 in FIG. 1, for example. Not all of the possible components of the sensor package 600 are illustrated in FIGS. 6A-6B for the sake of simplicity. The sensor package 600 can be extended for example by one or more components of the sensor package 100 from FIG. 1.

The sensor package 600 can comprise a pressure sensor 58, which can be configured to detect absolute pressures and/or relative pressures. Furthermore, the sensor package 600 can comprise an acceleration sensor, which can be configured to detect accelerations. The associated sensor cells are shown in the plan view in FIG. 6B. Each of the two sensor cells can have sensor cavities and/or sensor openings. A gas opening 20 and a cavity 26 of the pressure sensor are shown by way of example in the side view in FIG. 6A. The sensor package 600 can comprise one or more electrical terminals 44.

A dimension 1 of the sensor package 600 in the x-direction can be in a range of approximately 2000 micrometers to approximately 2400 micrometers. One typical example value for the dimension 1 can be approximately 2200 micrometers. A dimension b of the sensor package 600 in the y-direction can be in a range of approximately 2200 micrometers to approximately 2600 micrometers. One typical example value for the dimension b can be approximately 2400 micrometers. With regard to the dimensions of the components of the sensor package 600 in the z-direction, reference is made to FIG. 1.

Figure 7:
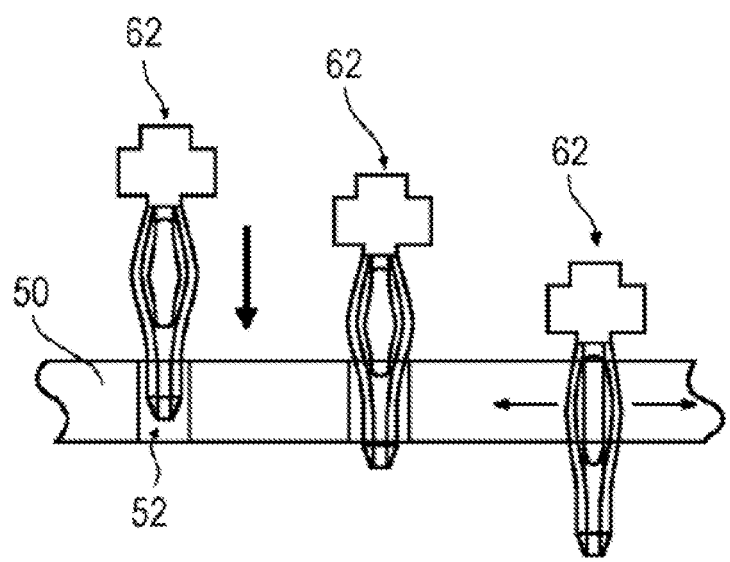
FIG. 7 shows a side view of a press-fit method.

FIG. 7 shows in a side view steps of a press-fit method such as can be employed for example in the method in FIGS. 2A-2I (cf. FIG. 2G, in particular). A press-fit pin 62 can be pressed into a through hole 52 of a cover 50 (cf. vertical arrow). The press-fit pin 62 can have a spring property in its central region, which spring property can provide a fixed positioning of the press-fit pin 62 in the through hole 52 (cf. horizontal arrows). A connection between the lower section of the press-fit pin 62 and an electrical contact of a logic chip 14 (not shown) can be provided for example by a conductive adhesive or a solder material. The press-fit pin 62 can be plated, for example with tin and/or NiPdAu. A section of the press-fit pin that projects from the upper main surface of the cover 50 can be configured to be connected to a circuit board (not shown). Only one press-fit pin 62 is shown in FIG. 7 for the sake of simplicity. A multiplicity of press-fit pins 62 can be provided in the form of a leadframe, wherein the arrangement of the press-fit pins 62 in the leadframe can be coordinated with the geometry of a plurality of through holes 52.

EXAMPLES

Sensor packages and methods for producing sensor packages are explained below on the basis of examples.

Example 1 is a sensor package comprising: a MEMS sensor chip; a cover arranged over a first main surface of the MEMS sensor chip, the cover being fabricated from a mold compound; and an electrical through contact extending through the cover and configured to electrically couple the sensor package to a circuit board arranged over the cover.

Example 2 is a sensor package according to example 1, wherein the cover and the MEMS sensor chip are substantially congruent in a plan view of the first main surface of the MEMS sensor chip.

Example 3 is a sensor package according to example 1 or 2, furthermore comprising: a logic chip arranged between the MEMS sensor chip and the cover and configured to logically process measurement signals provided by the MEMS sensor chip, wherein the electrical through contact is configured to electrically couple the logic chip to the circuit board.

Example 4 is a sensor package according to any of the preceding examples, furthermore comprising: a gas opening arranged over a second main surface of the MEMS sensor chip, the second main surface being situated opposite the first main surface.

Example 5 is a sensor package according to example 4, furthermore comprising: a first structure arranged over the second main surface of the MEMS sensor chip, the first structure being fabricated from at least one from a glass material or a semiconductor material, wherein the gas opening is formed in the first structure.

Example 6 is a sensor package according to any of the preceding examples, furthermore comprising: a second structure arranged over the first main surface of the MEMS sensor chip, the second structure being fabricated from at least one from a glass material or a semiconductor material; and a cavity formed in the second structure and arranged over a MEMS structure of the MEMS sensor chip.

Example 7 is a sensor package according to any of the preceding examples, wherein the electrical through contact comprises an electrical via connection.

Example 8 is a sensor package according to any of the preceding examples, wherein the electrical through contact comprises at least one from a press-fit pin, a metal column, a clip or a bond wire.

Example 9 is a sensor package according to any of the preceding examples, wherein the electrical through contact is configured to mechanically couple the sensor package to the circuit board.

Example 10 is a sensor package according to any of examples 1 to 8, furthermore comprising: a peripheral connection element arranged over the cover and electrically coupled to the electrical through contact, wherein the peripheral connection element is configured to electrically and mechanically couple the sensor package to the circuit board.

Example 11 is a sensor package according to example 10, furthermore comprising: a redistribution layer arranged between the cover and the peripheral connection element, the redistribution layer electrically coupling the electrical through contact and the peripheral connection element.

Example 12 is a sensor package according to example 11, wherein the redistribution layer comprises at least one conductor track, wherein the at least one conductor track is configured to provide an electronic component.

Example 13 is a sensor package according to any of the preceding examples, wherein the MEMS sensor chip is configured to detect pressure signals.

Example 14 is a method for producing sensor packages, wherein the method comprises: providing a first semiconductor wafer having a plurality of MEMS sensor chips; carrying out a molding process over a first main surface of the first semiconductor wafer, wherein a cover is formed over the plurality of MEMS sensor chips; forming electrical through contacts extending through the cover; and singulating the first semiconductor wafer and the cover into a plurality of sensor packages, wherein each of the sensor packages comprises one of the electrical through contacts, which is configured to electrically couple the sensor package to a circuit board arranged over the cover of the sensor package.

Example 15 is a method according to example 14, furthermore comprising: before carrying out the molding process, arranging a plurality of logic chips over the first main surface of the first semiconductor wafer using a pick-and-place process; and electrically coupling the logic chips to the MEMS sensor chips.

Example 16 is a method according to example 14, furthermore comprising: before carrying out the molding process, arranging a second semiconductor wafer having a plurality of logic chips over the first main surface of the first semiconductor wafer; and electrically coupling the logic chips to the MEMS sensor chips.

Example 17 is a method according to example 15 or 16, furthermore comprising: after carrying out the molding process, forming a plurality of through holes in the cover; and forming the electrical through contacts in the through holes, wherein the electrical through contacts electrically contact the logic chips.

Example 18 is a method according to example 17, wherein forming the electrical through contacts in the through holes comprises pressing press-fit pins into the through holes.

Example 19 is a method according to example 15 or 16, furthermore comprising: before carrying out the molding process, electrically contacting the logic chips with electrical contact elements, wherein the electrical contact elements comprise at least one from metal columns, clips or bond wires; and after carrying out the molding process, at least partly removing material of the cover at a main surface of the cover facing away from the first semiconductor wafer, wherein the electrical contact elements are at least partly exposed as a result of the material being removed.

Example 20 is a method according to example 19, wherein electrically contacting the logic chips with the electrical contact elements comprises: arranging a leadframe over the logic chips, wherein the leadframe comprises the electrical contact elements.

Example 21 is a method according to any of examples 14 to 20, furthermore comprising: before carrying out the molding process, connecting a first substrate to the first main surface of the first semiconductor wafer, wherein the first substrate is fabricated from at least one from a glass material or a semiconductor material, wherein the first substrate comprises a plurality of cutouts that are aligned with MEMS structures of the MEMS sensor chips before the connecting.

Example 22 is a method according to any of examples 14 to 21, furthermore comprising: before carrying out the molding process, connecting a second substrate to a second main surface of the first semiconductor wafer, the second main surface being opposite the first main surface, wherein the second substrate is fabricated from at least one from a glass material or a semiconductor material, wherein the second substrate comprises a plurality of gas openings that are aligned with the MEMS sensor chips before the connecting.

Although specific implementations have been illustrated and described herein, it is obvious to the person skilled in the art that a multiplicity of alternative and/or equivalent implementations can replace the specific implementations shown and described, without departing from the scope of the present disclosure. This application is intended to cover all adaptations or variations of the specific implementations described herein. Therefore, the intention is for this disclosure to be restricted only by the claims and the equivalents thereof

The invention claimed is:

1. A sensor package, comprising:
   a microelectromechanical systems (MEMS) sensor chip;
   a cover arranged over a first main surface of the MEMS sensor chip, the cover being fabricated from a mold compound;
   an electrical through contact extending through the cover and configured to electrically couple the sensor package to a circuit board arranged over the cover; and
   a logic chip arranged between the MEMS sensor chip and the cover, wherein the logic chip is configured to logically process measurement signals provided by the MEMS sensor chip.

2. The sensor package as claimed in claim 1, wherein the cover and the MEMS sensor chip are substantially congruent in a plan view of the first main surface of the MEMS sensor chip.

3. The sensor package as claimed in claim 1, wherein the electrical through contact is configured to electrically couple the logic chip to the circuit board.

4. The sensor package as claimed in claim 1, further comprising:
a gas opening arranged over a second main surface of the MEMS sensor chip, the second main surface being situated opposite the first main surface.

5. The sensor package as claimed in claim 4, further comprising:
a first structure arranged over the second main surface of the MEMS sensor chip, the first structure being fabricated from at least one from a glass material or a semiconductor material,
wherein the gas opening is formed in the first structure.

6. The sensor package as claimed in claim 1, further comprising:
a second structure arranged over the first main surface of the MEMS sensor chip, the second structure being fabricated from at least one from a glass material or a semiconductor material; and
a cavity formed in the second structure and arranged over a MEMS structure of the MEMS sensor chip.

7. The sensor package as claimed in claim 1, wherein the electrical through contact comprises an electrical via connection.

8. The sensor package as claimed in claim 1, wherein the electrical through contact comprises at least one of a press-fit pin, a metal column, a clip, or a bond wire.

9. The sensor package as claimed in claim 1, wherein the electrical through contact is configured to mechanically couple the sensor package to the circuit board.

10. The sensor package as claimed in claim 1, further comprising:
a peripheral connection element arranged over the cover and electrically coupled to the electrical through contact,
wherein the peripheral connection element is configured to electrically and mechanically couple the sensor package to the circuit board.

11. The sensor package as claimed in claim 10, further comprising:
a redistribution layer arranged between the cover and the peripheral connection element, the redistribution layer electrically coupling the electrical through contact and the peripheral connection element.

12. The sensor package as claimed in claim 11, wherein the redistribution layer comprises at least one conductor track, wherein the at least one conductor track is configured to provide an electronic component.

13. The sensor package as claimed in claim 1, wherein the MEMS sensor chip is configured to detect pressure signals.

14. A method, comprising:
providing a first semiconductor wafer having a plurality of microelectromechanical systems (MEMS) sensor chips;
carrying out a molding process over a first main surface of the first semiconductor wafer, wherein a cover is formed over the plurality of MEMS sensor chips;
forming electrical through contacts extending through the cover; and
singulating the first semiconductor wafer and the cover into a plurality of sensor packages, wherein each of the plurality of sensor packages comprises one of the electrical through contacts, which is configured to electrically couple the sensor package to a circuit board arranged over the cover of the sensor package.

15. The method as claimed in claim 14, further comprising:
before carrying out the molding process, arranging a plurality of logic chips over the first main surface of the first semiconductor wafer via a pick-and-place process; and
electrically coupling the plurality of logic chips to the plurality of MEMS sensor chips.

16. The method as claimed in claim 15, further comprising:
after carrying out the molding process, forming a plurality of through holes in the cover; and
forming the electrical through contacts in the plurality of through holes, wherein the electrical through contacts electrically contact the plurality of logic chips.

17. The method as claimed in claim 16, wherein forming the electrical through contacts in the plurality of through holes comprises pressing press-fit pins into the plurality of through holes.

18. The method as claimed in claim 15, further comprising:
before carrying out the molding process, electrically contacting the plurality of logic chips with electrical contact elements, wherein the electrical contact elements comprise at least one of metal columns, clips, or bond wires; and
after carrying out the molding process, at least partly removing material of the cover at a main surface of the cover facing away from the first semiconductor wafer, wherein the electrical contact elements are at least partly exposed as a result of the material being removed.

19. The method as claimed in claim 18, wherein electrically contacting the plurality of logic chips with the electrical contact elements comprises:
arranging a leadframe over the plurality of logic chips, wherein the leadframe comprises the electrical contact elements.

20. The method as claimed in claim 14, further comprising:
before carrying out the molding process, arranging a second semiconductor wafer having a plurality of logic chips over the first main surface of the first semiconductor wafer; and
electrically coupling the plurality of logic chips to the plurality of MEMS sensor chips.

21. The method as claimed in claim 14, further comprising:
before carrying out the molding process, connecting a first substrate to the first main surface of the first semiconductor wafer,
wherein the first substrate is fabricated from at least one from a glass material or a semiconductor material, and
wherein the first substrate comprises a plurality of cutouts that are aligned with MEMS structures of the plurality of MEMS sensor chips before the connecting.

22. The method as claimed in claim 14, further comprising:
before carrying out the molding process, connecting a second substrate to a second main surface of the first semiconductor wafer, the second main surface being situated opposite the first main surface,
wherein the second substrate is fabricated from at least one from a glass material or a semiconductor material, and wherein the second substrate comprises a plurality of gas openings that are aligned with the plurality of MEMS sensor chips before the connecting.

\* \* \* \* \*